United States Patent [19]

Pike

[11] Patent Number: 4,623,591
[45] Date of Patent: Nov. 18, 1986

[54] AMORPHOUS HYDRATED METAL OXIDE PRIMER FOR ORGANIC ADHESIVELY BONDED JOINTS

[75] Inventor: Roscoe A. Pike, Granby, Conn.

[73] Assignee: United Technologies Corporation, Hartford, Conn.

[21] Appl. No.: 774,256

[22] Filed: Sep. 9, 1985

[51] Int. Cl.$^4$ ............................................. B32B 27/38
[52] U.S. Cl. .................................... 428/414; 428/416; 428/469; 428/702; 427/208.2; 427/409; 156/151; 156/314
[58] Field of Search .................. 427/208.4, 208.2, 409, 427/410; 156/151, 314; 428/414, 416, 469, 702

[56] References Cited

U.S. PATENT DOCUMENTS

| | | | |
|---|---|---|---|
| 4,085,012 | 4/1978 | Marceau et al. | 204/38 A |
| 4,364,995 | 12/1982 | Crawford et al. | 428/336 |
| 4,532,179 | 7/1985 | Takami et al. | 428/335 |
| 4,562,104 | 12/1985 | Maeda | 428/148 |

Primary Examiner—John E. Kittle
Assistant Examiner—Patrick J. Ryan
Attorney, Agent, or Firm—A. Dean Olson

[57] ABSTRACT

An amorphous hydrated metal oxide primer for adhesively bonded articles results in a bond resistant to crack propagation. A plurality of articles at least one of which is metal are bonded to one another through a layer of polymeric adhesive. The metal article has a layer of amorphous hydrated metal oxide formed by applying and subsequent hydrolysis of a layer of $M_xOR_y$. In the formula $M_xOR_y$, x is 1, y is 3 or 4, M is any metal capable of forming a stable alkoxide and R is an organic radical. The bonded joint is preferably made by applying to a surface of at least one metal article a layer of $M_xOR_y$ wherein x is 1, y is 3 or 4, M is any metal capable of forming a stable alkoxide and R is an organic radical. The metal article having a layer of metal alkoxide is exposed to moisture and a temperature of about 25° C. to about 125° C. and adhesive is placed in contact with and between the metal article and other article. The two bonded articles are then exposed to pressure and optional heat resulting in a joint resistant to crack propagation.

10 Claims, 8 Drawing Figures

AMORPHOUS HYDRATED METAL OXIDE PRIMER FOR ORGANIC ADHESIVELY BONDED JOINTS

CROSS REFERENCE TO RELATED APPLICATION

Attention is directed to commonly assigned copending application entitled "Amorphous Hydrated Metal Oxide Primer for Composite Fibers", Ser. No. 06/774,257 filed on even date herewith, which discloses material similar to that used in the present application, the disclosure of which is hereby incorporated by reference.

DESCRIPTION

1. Technical Field

The field of art to which this invention pertains is adhesively bonded joints and methods for adhesively bonding joints.

2. Background Art

Weight saving and manufacturing cost benefits have led to the increase in use of adhesively bonded structures in the aircraft and aerospace industries. In order to be a viable alternative to, for example, metal fasteners, these adhesive bonds should maintain the strength typical of conventional fastener systems. In many applications the bonds are put under a variety of environmental and mechanical stresses. For example, frequently these bonds are exposed over long periods of time to wet environments which can result in a loss of bond strength. The loss of strength can result from the extension of cracks and other deformations that occur in the adhesive and which are exacerbated by the moist environment. As a result of this deficiency, extensive research and development efforts have been undertaken to define methods and identify materials which improve bonded joint performance in humid conditions. For example, it is known that surface preparation is important in the bonding of aluminum and titanium. Thus it is essential that before bonding, the adherend is cleaned and chemically pretreated to produce a surface which combines with the adhesive to develop the bond strengths which meet application requirements. A variety of pretreatments for aluminum have been developed to produce improved bondability. These include acid etching (FPL), and anodized treatments with sulfuric (SA), chromic (CAA) and phosphoric acid (PAA). The latter, PAA, is generally accepted as the most effective surface treatment in terms of bond strength and durability at the present time. It has been shown by in depth surface analysis using scanning transmission electron microscopy that the PAA treatment produces fine oxide protrusions of greater length and magnitude than other surface treatments. These whiskers are believed to account for the strength enhancement achieved with joints made using PAA treated adherends. Thus, mechanical interlocking by whisker reinforcement of an adhesive appear to play a role in enhancing adhesive bonding. The probability that chemical interaction is of major importance, depending upon the polymer/metal combination, is also believed. Although the above surface preparations have provided advantages, there is a need for new technology to aid in the advancement of lightweight aerospace-type metal structures.

Accordingly, there is a constant search in this field of art for new methods of providing lightweight, structurally sound, adhesively bonded metal joints.

DISCLOSURE OF INVENTION

This disclosure is directed to bonded joints resistant to crack propagation. A plurality of articles are bonded to one another through a layer of polymeric adhesive at least one of said articles being a metal article. At least one of the metal articles has a layer of amorphous hydrated metal oxide thereon and in contact with the adhesive layer. The layer of amorphous hydrated metal oxide is formed by application onto the metal article and subsequent hydrolysis of, a layer of $M_x(OR)_y$. In the formula $M_x(OR)_y$, x is 1, y is 3 or 4, M is any metal capable of forming a stable alkoxide and R is an organic radical.

Another aspect of this invention is a method of bonding a plurality of articles together that results in a joint resistant to crack propagation. A polymeric adhesive is placed in contact with and between the two articles and pressure and optional heat is applied to the articles. A layer of $M_x(OR)_y$ is applied to a surface of at least one of the metal articles prior to placing adhesive on the surface. In the formula $M_x(OR)_y$, x is 1, y is 3 or 4, M is any metal capable of forming a stable alkoxide and R is an organic radical. The metal article having $M_x(OR)_y$ layer thereon is exposed to moisture and a temperature of about 25° C. to about 125° C. prior to contact with the adhesive.

This amorphous metal oxide primer for adhesively bonded joints provides bonds that are more resistant to crack propagation. Thus, this invention makes a significant advance to the aerospace industry by providing new technology relating to adhesive bonding Other features and advantages will be apparent from the specification and claims and from the accompanying drawings which illustrate an embodiment of the invention.

BEST MODE FOR CARRYING OUT THE INVENTION

Figure 1:
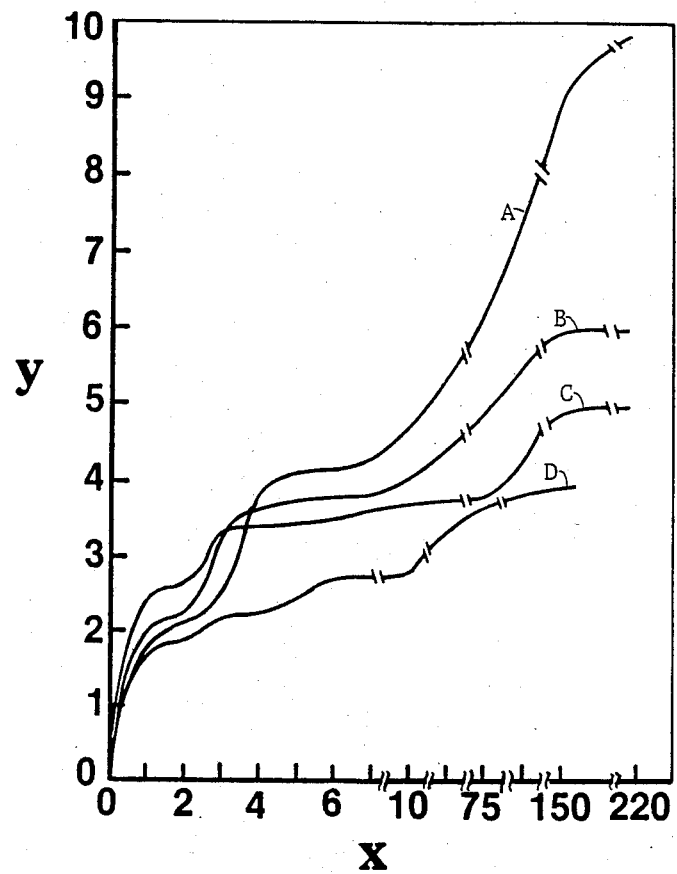
FIG. 1 illustrates crack propagation for various amorphous hydrated metal oxide primed aluminum adherend adhesive bonds.

Any metal alkoxide that hydrolizes to give an amorphous hydrated metal oxide (i.e. a monohydroxy metal oxide) may be used in the practice of this invention. Metal alkoxides having the formula $M_x(OR)_y$ where x is 1 and y is 3 or 4 are preferred in forming the metal oxide primer of this disclosure, y being determined by the particular valence of the metal. y should not be 2 as typically a valence of at least 3 is necessary to form a monohydroxy metal oxide. M is any metal capable of forming a stable alkoxide, which can be purified by, for example, distillation or crystallization without decomposition; as y is defined above essentially all metals meet this requirement. It is preferred that the metal is selected from the group consisting of titanium, zirconium, silicon, iron, nickel and aluminum. Typically, R can be any organic radical that can be distilled at temperatures below about 300° C. Since the alkoxide ((OR) moiety) is not incorporated into the primer, the important criteria associated with it is that the resultant alcohol can be volatilized at temperatures that are not high enough to damage the primer or substrate. It is preferred that R is an alkane radical from $C_1$ to $C_{10}$. It is especially preferred that R is methyl, ethyl, propyl or sec-butyl as these radicals are volatilized as alcohols at relatively low temperatures. In addition, the alkoxides can be modified by incorporation of varying amounts of additives such as phosphate, chromate or magnesium oxide without affecting the primer properties. Mixtures of the above metal alkoxides may be used in the practice of this invention.

The above metal alkoxides hydrolize to amorphous hydrated metal oxides (primer) when exposed to moisture such as atmospheric moisture or moisture on the metal substrate surface and optionally heat as described below. An exemplary reaction believed to occur is that of aluminum alkoxide to alumina. The initial hydrolysation reaction of aluminum alkoxides is empirically illustrated as $$Al(OR)_3 + H_2O \rightarrow Al(OR)_2(OH) + R(OH) \quad (1)$$

This reaction proceeds rapidly with further hydrolysation-polymerisation to

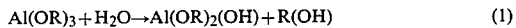

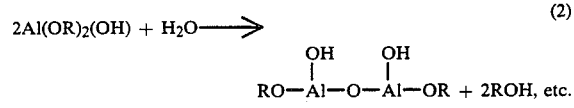

to incorporate n aluminum ions, i.e. $Al_nO_{n-1}(OH)_{(n+2)-x}(OR)_x$ assuming linear polymerisation for simplicity. As the reaction proceeds the number of OR groups, i.e. x, relative to n decreases to a value depending on the hydrolysis temperature and available moisture concentration. Under normal application conditions, the ratio of residual OR groups as designated by x is less than 4 and n is 28 or greater. Such low levels of OR do not impede the performance of the primer. In contrast, zirconium alkoxide is believed to hydrolize to a hydrated oxide, i.e. $ZrO_2.1.7H_2O$ having no residual —OR or OH groups.

The thickness of this primer layer can vary effectively from about 0.15 microns ($\mu$) to about $10\mu$. Preferably the thickness is about $0.3\mu$ to about $1.0\mu$. Above about $10\mu$, the layer can be so thick as to create stress risers and to form a weak boundary layer. Below about $0.15\mu$, the layer does not provide the properties such as crack propagation resistance at the levels typically required. In addition, it is preferable to apply the primer to the metal surface with a plurality of layers of metal alkoxide as this facilitates removal of volatiles and solvent which can be more difficult to achieve from a single thick application.

The articles of this invention comprise metals or alloys thereof capable of having an oxide scale exhibiting sufficient strength to prevent it from being debonded from the substrate, i.e. an adherent scale. The adherent oxide surface may be naturally occurring such as with alumina ($Al_2O_3$) or it may require a special pretreatment to produce a man-made adherent oxide, such as the case with gold, where the naturally occurring oxide is non-adherent or does not form. Preferably, the metal article is selected from the group consisting of aluminum, titanium, nickel, iron, copper or their alloys. By alloy is meant the article having the major metal present in greater than a 50 percent by weight (%) amount. In addition, a primed metal article can be bonded to a conventional fiber reinforced polymeric matrix composite such as an epoxy, polyimide, polyester, acrylic, urethane, cellulosic, rubber or phenolic based composite. Examples of fibers include glass, alumina, silicon carbide, graphite, amides and Kevlar TM fiber (DuPont DeNemours, E.I., Co., Wilmington, Del.).

Any of the above described metal alkoxides or mixtures thereof can be used to prime any of the above described metal articles, the composition of the mixture having little effect except that it is preferred to prime the articles with the alkoxide of like composition. Thus, for example, properties such as crack propagation are enhanced when aluminum alkoxide is applied to aluminum articles.

Typically, a surface treatment material is used prior to primer application to provide the metal surface with an adhesive receptive quality. For example, conventional surface preparation compositions for aluminum are acidic in nature such as chromic acid, phosphoric acid and sulfuric acid.

Any conventional adhesive can be used for the practice of this invention that is useful for bonding articles, particularly metal articles. For example, epoxide, polyimide, acrylic or urethane adhesives are used as these provide the properties most desired such as good strength. It is especially preferred to use epoxy or urethane adhesives as they resist environmental stresses, are strong and are frequently chosen for aerospace applications.

Any method of bonding may be used for the practice of this invention that provides an amorphous, hydrated metal oxide coated metal article bonded to another article with an adhesive. If a plurality of metal articles are to be bonded, it is preferred to prime each metal article. It is also preferred to apply a layer of metal alkoxide to the metal article(s) by a solvent casting, dipping or spraying procedure. The metal alkoxide coated metal articles are then maintained at a temperature of about 25° C. to about 300° C. in the presence of moisture. Below 25° C., the reaction kinetics are typically too slow and above 300° C. loss of desirable metal properties or crystalization of the oxide surface may occur with an accompanying loss of mechanical strength. It is especially preferred to heat the metal alkoxide coated articles to a temperature of about 25° C. to about 125° C. as the lower temperatures minimize the risk of mechanical property degradation of, for example, aluminum substrates, such as with aluminum spars which have been shot peened to induce compressive surface stresses. The application of the inorganic primer for field repair situations is also possible with the use of the lower conversion temperature.

The following Table I illustrates the effect of temperature on the aluminum alkoxide conversion to amorphous aluminum oxide. To determine if there is a minimum temperature which the alkoxide to oxide (hydrated) conversion could be carried out, a range of temperatures from room temperature (RT) to 325° C. was tested using EA-9649 TM epoxy adhesive, available from Hysol (Pittsburgh, Calif.) bonded wedge crack specimens. These wedge crack tests were performed in accordance with the American Society for Testing and Materials (A.S.T.M.) D3762 procedure. In that procedure a wedge is driven into the joint bond area a predetermined length, forming a crack between the two bonded adherends. The length of any subsequent crack propagation which occurs under temperature and humidity exposure is a measurement of the crack resistance of the bonded joint. The results of the tests are listed in Table I.

Surprisingly, the total crack growth for 100 hours was found to be essentially the same over the temperature conversion range investigated.

TABLE I

Wedge Crack Propagation and Effect of Alkoxide Conversion Temperature

| Time (hours)[a] | Crack Length | \multicolumn{5}{c}{Conversion Temp.(°C.)} |
|---|---|---|---|---|---|---|
| | | 20 | 70 | 120 | 220 | 325 |
| | | \multicolumn{5}{c}{Crack Propagation} |
| | initial crack length, millimeters (mm)[b] | 47 | 48.5 | 48 | 47 | 46 |
| 1 | increase in crack length (mm) | 1.9 | 1.2 | 1.4 | 1.85 | 1.5 |
| 4 | increase in crack length (mm) | 0.3 | 0.5 | 0.7 | 1.0 | 0.75 |
| 20 | increase in crack length (mm) | | | 1.2 | 1.24 | 1.0 |
| 34 | increase in crack length (mm) | 1.5 | 1.1 | | | |
| 100 | increase in crack length (mm) | | | 0.2 | 1.3 | 1.0 |
| 122 | increase in crack length (mm) | 1.45 | 2.6 | | | |
| Total Propagated Crack Length | | 5.15 | 5.4 | 3.5 | 5.4 | 4.25 |

[a] At 71° C./95% Relative Humidity (R.H.), 2024 aluminum adherends, PAA treated, EA-9649 adhesive.
[b] Crack length resulting from wedge insertion.

It is also preferred to prepare the surface of the article prior to applying the metal alkoxide. For example, the surface of aluminum articles can be prepared with an acid such as phosphoric acid by, i.e. anodization. The adhesive is then applied by conventional methods to the articles and they are joined together with the application of conventional pressures, temperatures and times appropriate for the adhesive used.

EXAMPLE 1

2024 aluminum alloy adherends were treated with a 12% phosphoric acid solution by anodization (R.T.; 8 volts) and then E-8385 aluminum alkoxide available from Stauffer Chemical Company, Fairfield, Conn. was diluted to 1% with toluene and applied to the aluminum adherends by solvent casting (brushed on). The aluminum alkoxide was converted to amorphous aluminum by solvent evaporation at 325° C. after which a supported film of EA-9649 adhesive was applied to the amorphous aluminum coated aluminum adherends. A stop was placed between aluminum articles to insure a bond line thickness of about 0.127 millimeters (mm) and 1.757 kilogram per square centimeter (kg/cm$^2$) pressure was applied at 177° C. for 120 minutes. Wedge crack tests were carried out per ASTM D-3762 and the results are detailed following the next example as part of FIG. 1.

EXAMPLE 2

2024 aluminum alloy adherends were treated with a standard FPL etch solution by soaking and then E-8385 aluminum alkoxide was diluted to 1% with toluene and applied to the aluminum adherends by solvent casting. The aluminum alkoxide was converted to amorphous aluminum by solvent evaporation at 325° C. temperature after which a supported film of EA-9628 TM epoxy adhesive available from Hysol was applied to the amorphous aluminum coated aluminum adherends. A stop was placed between aluminum articles to insure a bond line thickness of about 0.127 mm and 1.757 kg/cm$^2$ pressure was applied at 121° C. for 120 minutes. Wedge crack tests were carried out per ASTM D-3762 and the results are detailed as part of FIG. 6.

These adhesively bonded aluminum joints are particularly resistant to crack propagation. A clear understanding of this may be had by reference to the Figures. FIGS. 1 thru 8 detail data about various wedge crack tests in which wedge crack test ASTM D3762, described above, was used.

In FIG. 1 crack propagation in mm Y is illustrated as a function of time X at 71° C. and 100% R.H. In this experiment, a PAA treatment and EA-9649 TM epoxy adhesive was used. The graphs illustrate the crack propagation for various amorphous hydrated metal oxide compositions. The metal alkoxides used in curves A-D were (in order) tetraethylsilicate, tetrapropoxy titanate, zirconium n-propoxide, and Al alkoxide.

Figure 2:
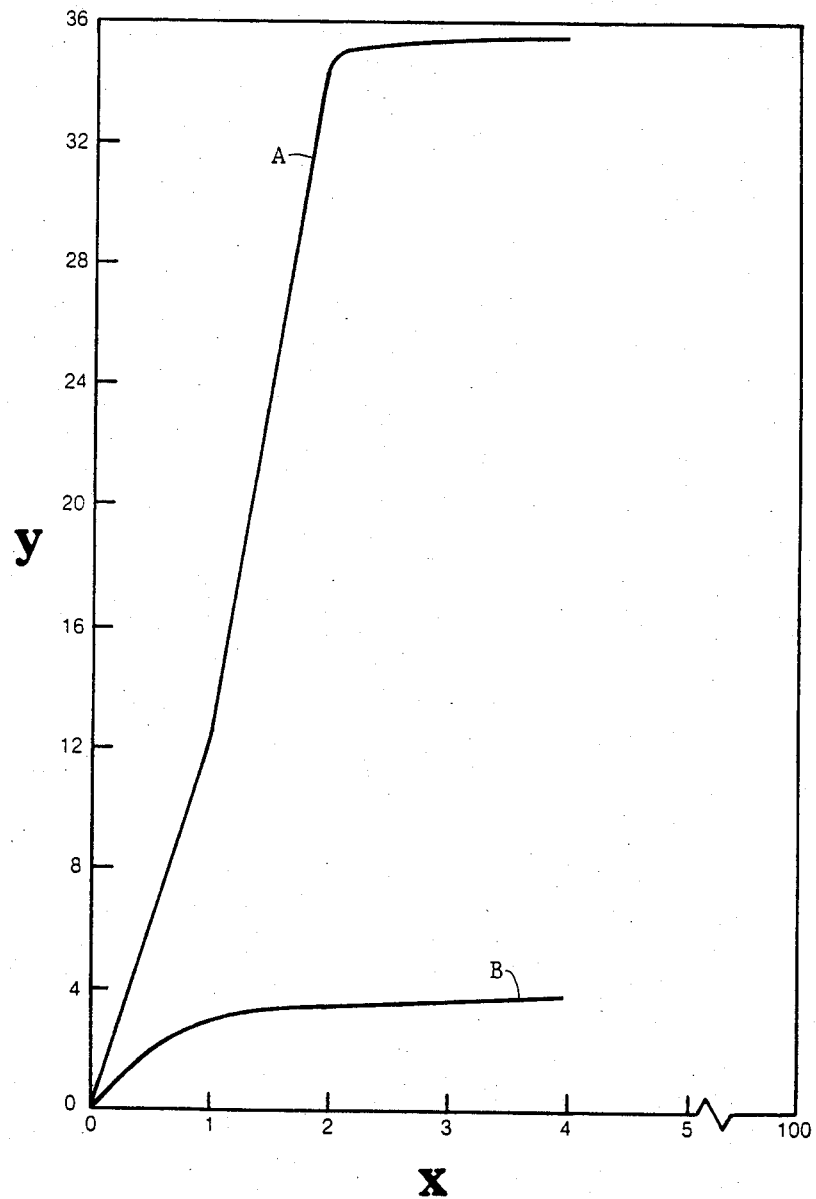
FIGS. 2 thru 6 compare crack propagation for amorphous hydrated alumina primed aluminum adherends compared to controls using organic primed aluminum adherends using a variety of adhesives and FPL and PAA surface treatments.

FIG. 2 illustrates crack propagation in mm Y as a function of time X at 71° C. and 100% R.H. In this experiment a PAA etch and EA-9649 TM was used. Again the amorphous aluminum primed joint (B) shows a great improvement over a typical organic resin primed aluminum joint such as the EA-9205 TM epoxy primer (A) available from Hysol or BR-127 TM epoxy primer (B) available from American Cyanamid.

Figure 3:
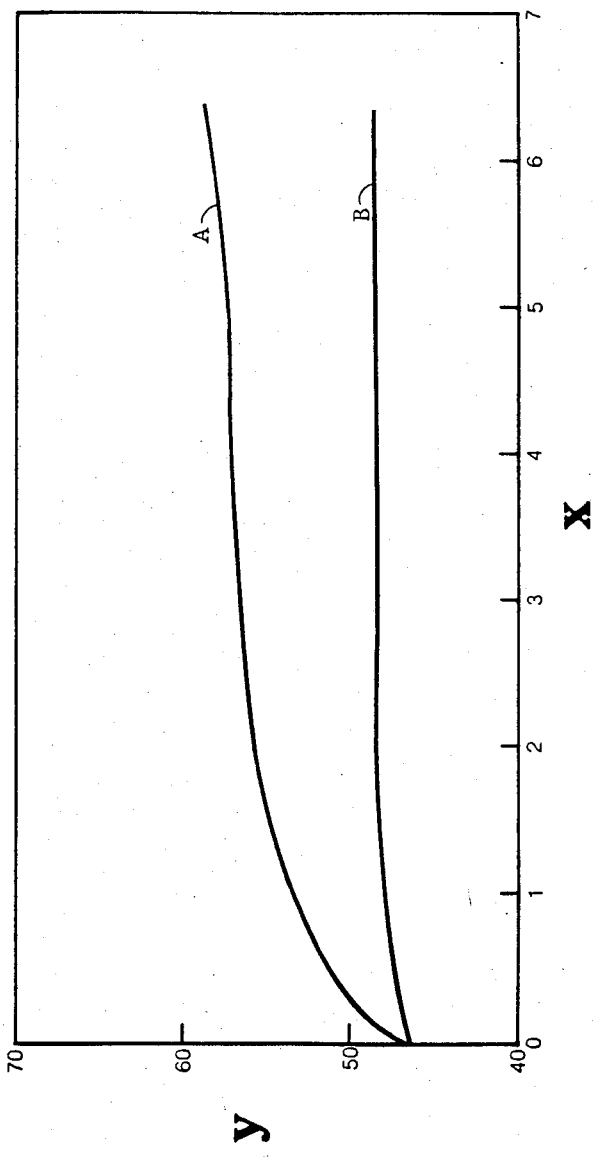

FIG. 3 illustrates crack propagation in mm Y as a function of time X at 71° C. and 100% R.H. In this experiment a FPL etch and EA-9649 adhesive was used. After several hours there is an improvement of about 20% for the Al alkoxide primer (B) over the typical EA-9205 epoxy primer (A).

Figure 4:
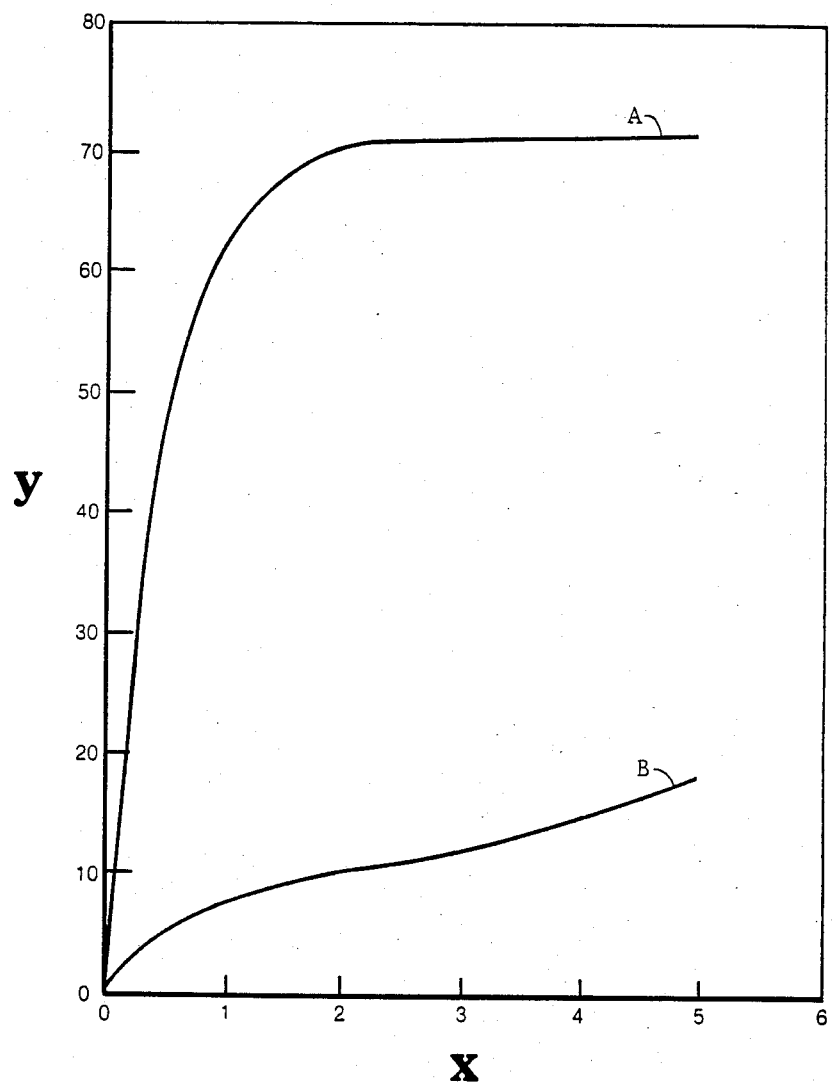

FIG. 4 illustrates another wedge crack test in which crack propagation in mm Y is given as a function of time X at 71° C. and 100% R.H. This test utilized a PAA etch and FM-300 resin adhesive available from American Cyanamid. There is almost a fourfold decrease in crack propagation resistance for the Al alkoxide primer (B) over the control (A) which utilized a BR-127 epoxy resin primer.

Figure 5:
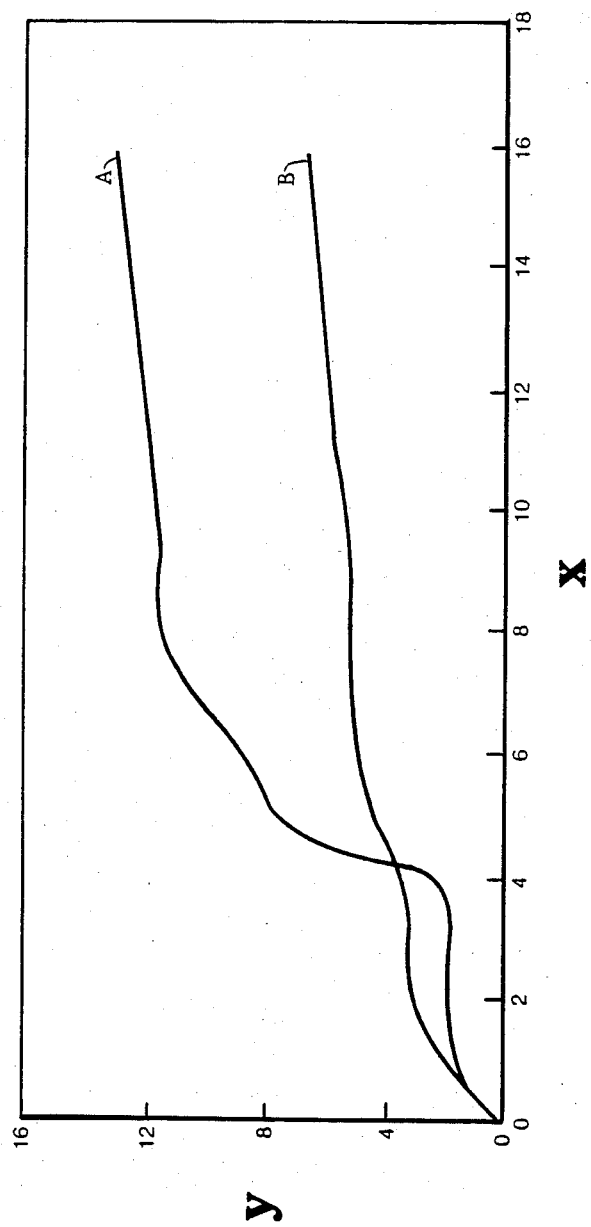

FIG. 5 illustrates a wedge crack test by plotting crack propagation mm Y against time X at 49° C. and 100% R.H. The experiment utilized a PAA etch and an EA-9628 adhesive resin. After several hours there is a marked decrease in crack propagation for the Al alkoxide primer (B) over the control which used an EA-9205 epoxy primer (A).

Figure 6:
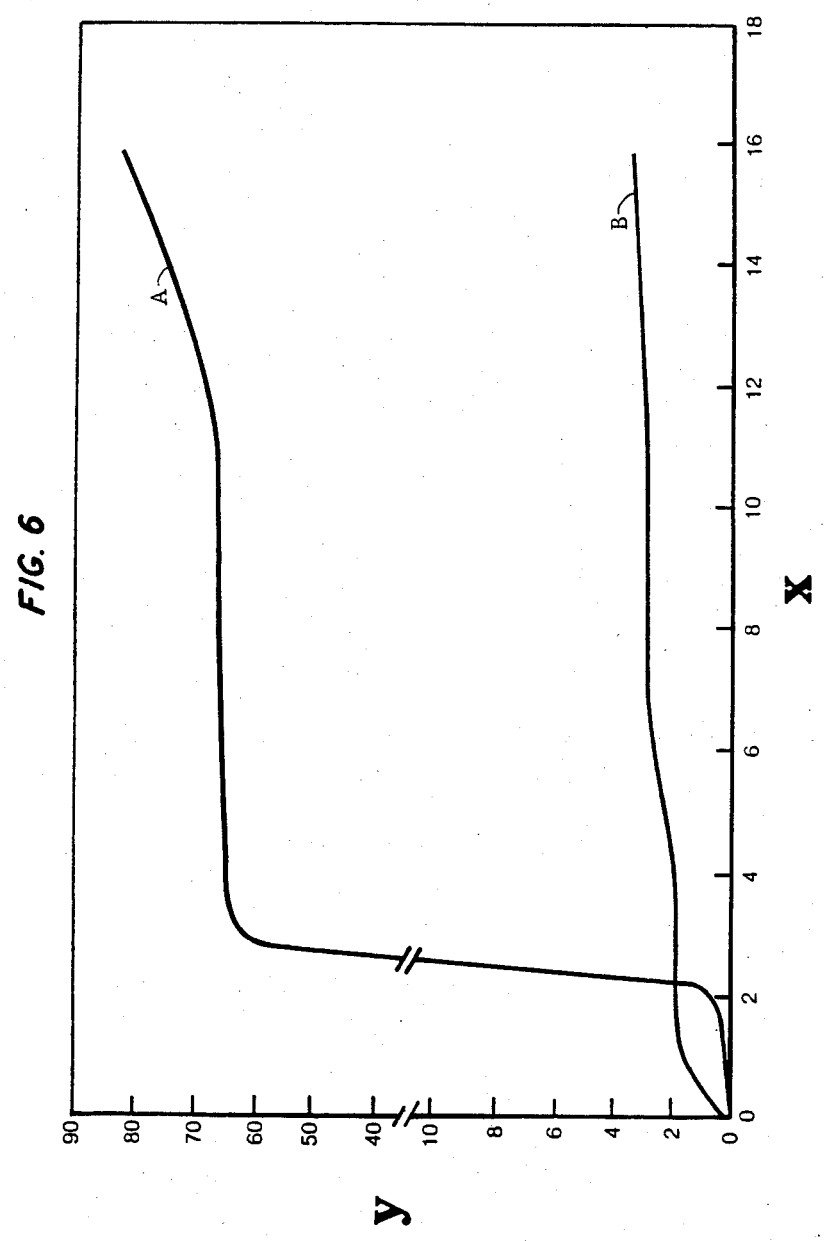

FIG. 6 illustrates another wedge crack test in which crack propagation in mm Y is graphed against time X at 49° C. and 100% R.H. This experiment utilized an FPL etch and an EA-9628 adhesive resin. There is a dramatic decrease in the crack propagation for the Al alkoxide primer (B) over the control (A) which used an EA-9205 epoxy organic primer.

Figure 7:
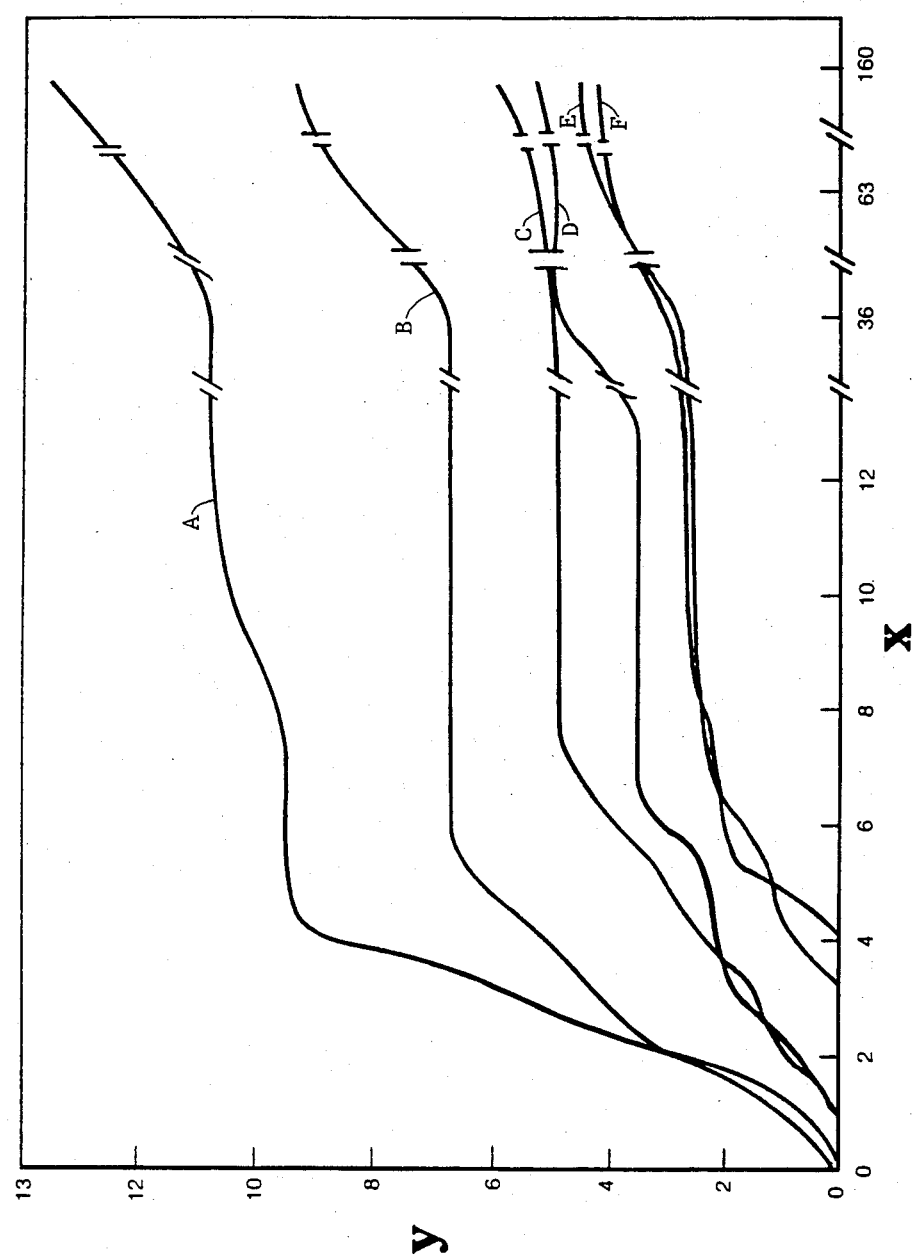
FIGS. 7 and 8 compare crack propagation for amorphous hydrated alumina primed aluminum adherend adhesive bonds having varying thicknesses of amorphous alumina primer.

FIG. 7 illustrates a wedge crack test in which crack propagation in mm Y is graphed against time X at 71° C. and 100% R.H. In this experiment a PAA etch was used in addition to an EA-9649 adhesive resin. In this experiment the number of primer coatings was increased from 1 to 6 corresponding to curves A-F resulting in the corresponding decrease in crack propagation.

Figure 8:
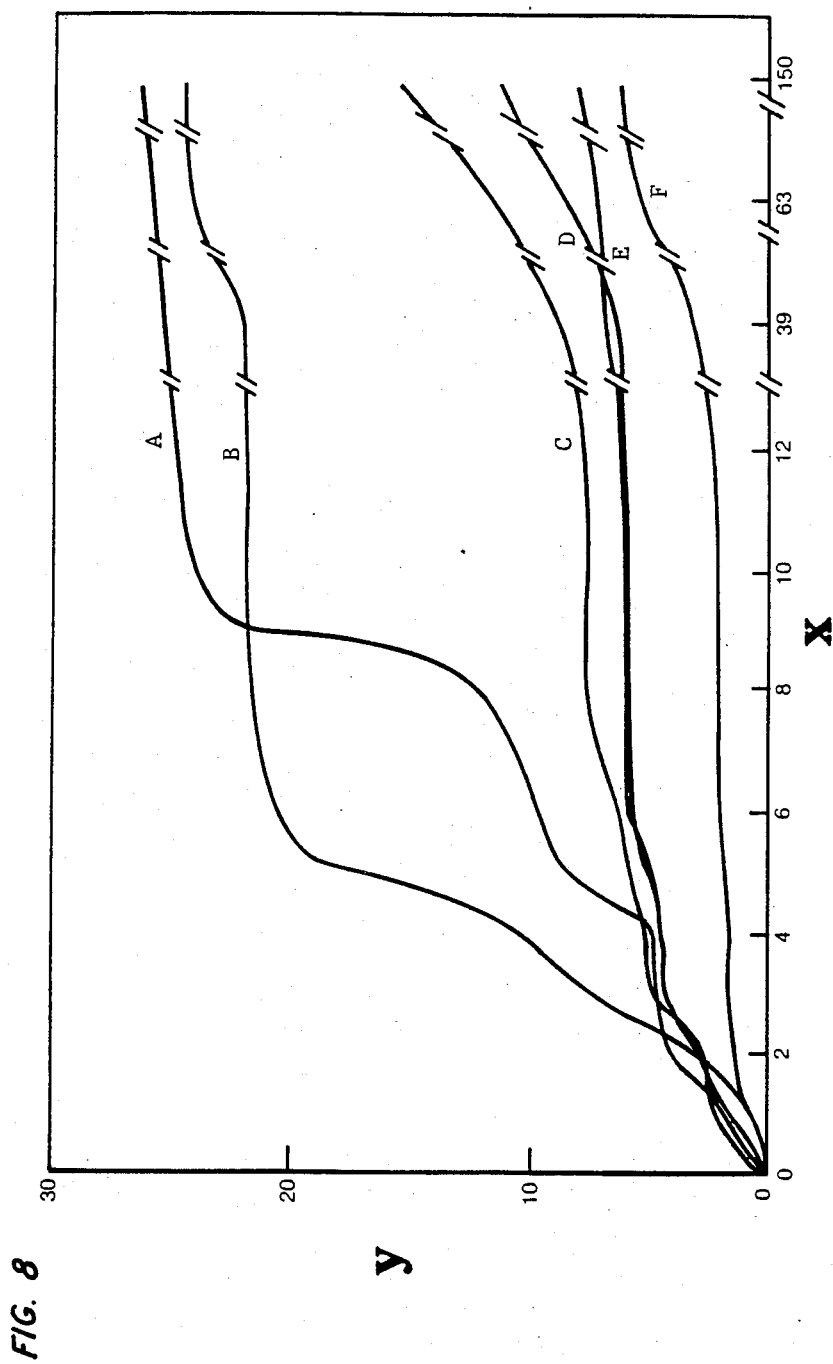

FIG. 8 illustrates another wedge crack test in which crack propagation in mm Y is graphed as a function of time X at 49° C. and 100% R.H. This experiment utilized a PAA etch with an AF-111 adhesive resin available from 3M Company (St. Paul, Minn.). Again the number of coatings was varied from 1 through 6 (Curves A-F) with a corresponding decrease in crack propagation as illustrated.

The tensile lap shear strengths of bonded joints made with the inorganic primer and standard organic primer using EA-9649 adhesive are listed in Table II below.

TABLE II

Tensile Lap Shear Strength of
EA-9649 Adhesive Bonded Aluminum at
Room Temperature

| | Tensile Lap Shear Strength | | | |
|---|---|---|---|---|
| | Dry | | Wet[a] | |
| Primer | Ksi[b] | MPa[b] | Ksi | MPa |
| Control EA-9205 epoxy primer | 5226 | 38.8 | 3740 | 25.8 |
| Al alkoxide | 5800 | 40.0 | 3712 | 25.6 |
| Al alkoxide + EA-9205 epoxy primer[c] | 5786 | 39.9 | 3727 | 25.7 |

[a]All failures 100% cohesive; tested at RT.
[b]1000 pounds per square inch (Ksi); 1000 pascals (MPa).
[c]Organic primer applied after formation of amorphous alumina coating.

The room temperature bond strengths both wet and dry were found to be equivalent.

This primer may be used to advantage in bonding metal to metal or metal to composites. In addition, it may be applied to articles to aid in adhesion of coatings such as with plastic packaged microelectronic devices, wire coatings, honeycomb construction, or even reinforcing composite fibers, note commonly assigned copending application, Ser. No. (774,257). While this invention has been described in terms of a metal alkoxide a mixture of various metal alkoxides can be used.

This primer coating provides improved crack propagation resistance in moist environments. The resulting properties such as tensile and T-peel strengths of bonded joints made with the inorganic primer are at least equivalent to bonded joints made using conventional organic primers. Yet the inorganic primers can be utilized at thinner layers than the 5μ to 10μ layers typical of organic primers. Thicker layers tend to set up stress rises (i.e. weak boundary layer) as the components segregate. Also, because of its thermal stability the inorganic primer can be used equally as well with high temperature adhesives such as polyimides or with low temperature adhesives such as epoxy systems unlike organic primers which are typically temperature specific. Another major advantage of the inorganic primer is that it can be used on metal surfaces which have been treated by a variety of surface treatments and provide the same high level of crack propagation resistance. In contrast, organic primers produce different results dependent upon the surface pretreatments employed. In addition, conventional organic primers use strontium chromates as corrosion inhibitors and these cause toxicity problems in their manufacture and use. This invention provides an amorphous hydrated metal oxide primer for adhesively bonded joints that results in greatly increased crack propagation resistance. Thus, it makes a significant advance in the aerospace industry by providing new technology relating to adhesively bonded joints.

It should be understood that the invention is not limited to the particular embodiments shown and described herein, but that various changes and modifications may be made without departing from the spirit and scope of this novel concept as defined by the following claims.

I claim:

1. A plurality of articles bonded to one another through a layer of polymeric adhesive of at least one of said articles being a metal article wherein the improvement comprises at least one of the metal articles having a layer of amorphous hydrated metal oxide thereon and in contact with the adhesive layer, the layer of amorphous hydrated metal oxide formed by application onto the metal article and subsequent hydrolysis of a layer of $M_x(OR)_y$, where
   (a) x is 1;
   (b) y is 3 or 4;
   (c) M is any metal capable of forming a stable alkoxide; and
   (d) R is an organic radical; resulting in a bond resistant to crack propagation.

2. The article as recited in claim 1 wherein the metal article is selected from the group consisting of iron, aluminum, titanium, steel, magnesium, nickel and their alloys.

3. The bonded articles of claim 1 wherein at least one article is a fiber reinforced polymeric composite.

4. The bonded articles of claim 1 wherein M is selected from the group consisting of titanium, zirconium, silicon, aluminum, nickel and iron.

5. The bonded articles of claim 1 wherein M is selected from the group consisting of titanium and aluminum.

6. A method of bonding a plurality of articles together at least one of which is metal by placing a polymeric adhesive in contact with and between the articles and applying pressure, and optionally heat, to said articles wherein the improvement comprises:
   (a) applying to a surface of at least one of the metal articles prior to placing adhesive on the surface a layer of $M_x(OR)_y$ wherein
      (i) x is 1;
      (ii) y is 3 or 4;
      (iii) M is any metal capable of forming a stable alkoxide; and
      (iv) R is an organic radical;
   (b) exposing the metal article having the $M_x(OR)_y$ layer thereon to moisture and a temperaure of about 25° C. to about 125° C. prior to contact with the adhesive;
resulting in a joint resistant to crack propagation.

7. The method of bonding as recited in claim 6 wherein the metal article is selected from the group consisting of aluminum, titanium, steel, magnesium, iron, nickel and their alloys.

8. The method of bonding as recited in claim 6 wherein at least one of the articles is a fiber reinforced polymeric composite.

9. The method of bonding as recited in claim 5 wherein M is selected from the group consisting of titanium, zirconium, silicon and aluminum.

10. The method of bonding as recited in claim 6 wherein M is selected from the group consisting of titanium and aluminum.

* * * * *